(12) United States Patent
Brown et al.

(10) Patent No.: US 8,383,454 B2
(45) Date of Patent: Feb. 26, 2013

(54) CHARGE INJECTION AND TRANSPORT LAYERS

(75) Inventors: Chris T. Brown, Pittsburgh, PA (US); Matthew K. Mathai, Gibsonia, PA (US); Venkataramanan Seshadri, Pittsburgh, PA (US)

(73) Assignee: Plextronics, Inc., Pittsburgh, PA (US)

( * ) Notice: Subject to any disclaimer, the term of this patent is extended or adjusted under 35 U.S.C. 154(b) by 0 days.

(21) Appl. No.: 13/316,324

(22) Filed: Dec. 9, 2011

(65) Prior Publication Data

US 2012/0083070 A1  Apr. 5, 2012

Related U.S. Application Data

(63) Continuation of application No. 12/605,768, filed on Oct. 26, 2009, now Pat. No. 8,097,876.

(60) Provisional application No. 61/108,844, filed on Oct. 27, 2008.

(51) Int. Cl.
*H01L 51/40* (2006.01)
(52) U.S. Cl. ............................. 438/99; 438/22
(58) Field of Classification Search .................. 438/99, 438/22
See application file for complete search history.

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 4,737,557 A | 4/1988 | Sato et al. | |
| 4,909,959 A | 3/1990 | Lemaire et al. | |
| 5,047,687 A | 9/1991 | VanSlyke | |
| 5,247,190 A | 9/1993 | Friend et al. | |
| 5,401,827 A | 3/1995 | Holmes et al. | |
| 5,454,880 A | 10/1995 | Sariciftci et al. | |
| 5,554,450 A | 9/1996 | Shi et al. | |
| 5,853,906 A | 12/1998 | Hsieh | |
| 5,968,674 A | 10/1999 | Hsieh et al. | |
| 6,166,172 A | 12/2000 | McCullough et al. | |
| 6,602,974 B1 | 8/2003 | McCullough et al. | |
| 6,812,399 B2 | 11/2004 | Shaheen et al. | |
| 6,908,783 B1 | 6/2005 | Kuehl et al. | |
| 6,933,436 B2 | 8/2005 | Shaheen et al. | |
| 7,569,159 B2 | 8/2009 | Hammond et al. | |
| 2005/0147846 A1 | 7/2005 | Marks et al. | |
| 2006/0076050 A1 | 4/2006 | Williams et al. | |
| 2006/0078761 A1 | 4/2006 | Williams et al. | |
| 2006/0175582 A1 | 8/2006 | Hammond et al. | |
| 2007/0138483 A1 | 6/2007 | Lee et al. | |
| 2008/0216894 A1 | 9/2008 | Hammond | |
| 2008/0248313 A1 | 10/2008 | Seshadri et al. | |
| 2009/0256117 A1 | 10/2009 | Seshadri et al. | |
| 2010/0108954 A1 | 5/2010 | Benson-Smith et al. | |

(Continued)

FOREIGN PATENT DOCUMENTS

EP 1801181 A2 6/2007
WO WO 2007-115540 A1 10/2007

(Continued)

OTHER PUBLICATIONS

U.S. Appl. No. 61/043,654, filed Apr. 9, 2008, Williams et al.

(Continued)

*Primary Examiner* — Long Pham
(74) *Attorney, Agent, or Firm* — Foley & Lardner LLP

(57) ABSTRACT

Compositions for use in hole transporting layers (HTLs) or hole injection layers (HILs) are provided, as well as methods of making the compositions and devices fabricated from the compositions. OLED devices can be made. The compositions comprise at least one conductive conjugated polymer, at least one semiconducting matrix component that is different from the conductive conjugated polymer, and an optional dopant, and are substantially free of an insulating matrix component.

40 Claims, 1 Drawing Sheet

U.S. PATENT DOCUMENTS

| | | | |
|---|---|---|---|
| 2010/0117030 | A1 | 5/2010 | McCullough et al. |
| 2010/0292399 | A1 | 11/2010 | Brown et al. |

FOREIGN PATENT DOCUMENTS

| | | | |
|---|---|---|---|
| WO | WO 2008-011953 | A1 | 1/2008 |
| WO | WO 2008-018931 | A2 | 2/2008 |
| WO | WO 2009-126918 | A1 | 10/2009 |

OTHER PUBLICATIONS

"Organic Light-Emitting Materials and Devices," Li, Z. and Meng, H. (Eds.), CRC Press (Taylor and Francis Group, LLC), Boca Raton, 2007, Chapter 1 (pp. 1-44), Chapter 2 (pp. 45-294), Chapter 3 (pp. 295-412), and Chapter 10 (pp. 617-638).

Anthopoulos et al., "Highly efficient single-layer dendrimer light-emitting diodes with balanced charge transport", Applied Physics Letters, vol. 82, No. 26, Jun. 30, 2003, pp. 4824-4826.

Concise Encyclopedia of Polymer Science and Engineering, Kroschwitz, J. (Ed.), Wiley, 1990, pp. 298-300.

Crivello, J., "The discovery and development of onium salt cationic photoinitiator", Journal of Polymer Science Part A. Polymer Chem., vol. 37, 1999, pp. 4241-4254.

Francois et al., "Block-copolymers with conjugated segments: Synthesis and structural characterization", Synth. Met., vol. 69, 1995, pp. 463-466.

Friend et al., "Electroluminescence in Conjugated Polymers", in Handbook of Conducting Polymers, $2^{nd}$ edition., Marcell Dekker, 1998, pp. 823-845.

Friend et al., "Polymer LEDs," Physics World, vol. 5, Nov. 1992, pp. 42-46.

Groenendaal et al., "Electrochemistry of Poly(3,4-alkylenedioxythiophene) Derivatives", Adv. Materials, vol. 15, 2003, pp. 855-879.

Hempenius et al., "A Polystyrene-Oligothiophene-Polystyrene Triblock Copolymer", J. Am. Chem. Soc., vol. 120, 1998, pp. 2798-2804.

International Search Report of PCT/US2009/062065.

Jenekhe et al., "Self-Assembled Aggregates of Rod-Coil Block Copolymers and Their Solubilization and Encapsulation of Fullerenes", Science, vol. 279, Mar. 20, 1998, pp. 1903-1907.

Katz et al., "Synthetic Chemistry for Ultrapure, Processable, and High-Mobility Organic Transistor Semiconductors," Accounts of Chemical Research, vol. 34, No. 5, 2001, pp. 359 and 365-367.

Kraft et al., "Electroluminescent Conjugated Polymers-Seeing Polymers in a New Light," Angew. Chem. Int. Ed., vol. 37, 1998, pp. 402-428.

Li et al., "Syntheses of Oligophenylenevinylenes-Polyisoprene Diblock Copolymers and Their Microphase Separation", Macromolecules, vol. 32, 1999, pp. 3034-3044.

McCullough et al., "Regioregular, Head-to-Tail Coupled Poly(3-alkylthiophene) and its Derivatives," Chapters 9 and 29, Handbook of Conducting Polymers, $2^{nd}$ Ed., 1998, pp. 225-258 and pp. 823-846.

McCullough, R., "The Chemistry of Conducting Polythiophenes," Adv. Mater., vol. 10., No. 2, 1998, pp. 93-116.

Non-final Rejection mailed Nov. 18, 2010 in U.S. Appl. No. 11/826,394.

Noshay et al., Block Copolymers, Overview and Critical Survey, Academic Press, 1977.

Patil et al., "Optical properties of conducting polymers", Chem. Rev., vol. 88, 1988, pp. 183-200.

Roncali, J., "Conjugated poly(thiophenes): systhesis, functionalization, and applications", Chem. Rev., vol. 92, 1992, p. 711.

Roncali, J., "Synthetic Principles for Bandgap Control in Linear π-Conjugated Systems", Chem. Rev., vol. 97, 1997, pp. 173-205.

Rothe et al., "Electrical doping is paving the way for the implementation of OLEDs in consumer electronics", Laser and Photonics Reviews, vol. 1, No. 4, pp. 303-306.

Schopf et al., Polythiophenes: Electrically Conductive Polymers, Springer: Berlin, 1997.

Seshadri et al., "Progress in Optically Transparent Conducting Polymers," Chapter 22, Organic Photovoltaics, Sun and Sariciftci (Eds.), CRC Press, 2005, pp. 495-527.

Tan et al., "White polymer light-emitting diodes based on poly(2-(4'-(diphenylamino)phenylenevinyl)-1,4-phenylene-alt-9, 9-n-dihexylfluorene-2, 7-diyl) doped wth a poly(p-phenylene vinylene) derivative", Thin Solid Films, Elsevier-sequoia S.A. Lausanne, CH, vol. 516, No. 1, Oct. 2, 2007, pp. 47-51, XP022282082.

Wang et al., "Syntheses of Amphiphilic Diblock Copolymers Containing a Conjugated Block and Their Self-Assembling Properties", J. Am. Chem. Soc., vol. 122, 2000, pp. 6855-6861.

Widawski et al., "Self-organized honeycomb morphology of star-polymer polystyrene films", Nature (London), vol. 369, Jun. 2, 1994, pp. 387-389.

Yamamoto et al., "Conjugated polymers bearing electronic and optical functionalities. Preparation, properties and their applications", Reactive & Functional Polymers, vol. 37, 1998, pp. 1-17.

Yang et al., "A soluble blue-light-emitting polymer", Macromolecules, vol. 26, 1993, pp. 1188-1190.

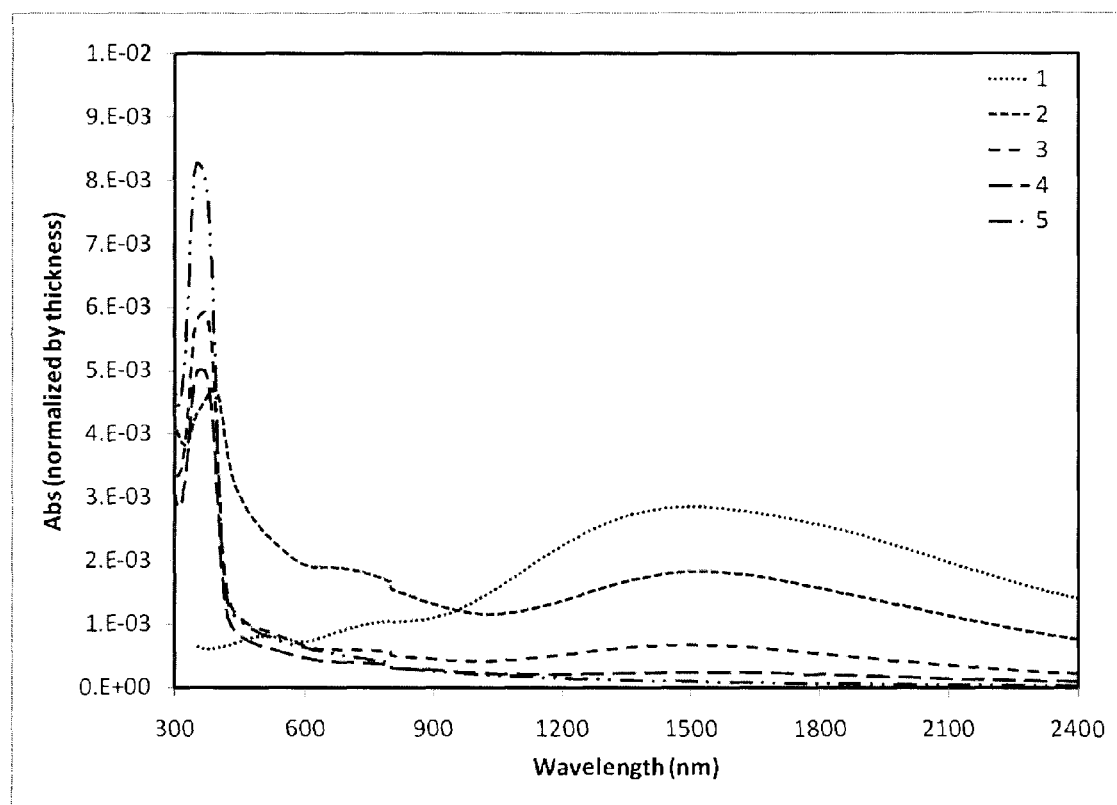

CHARGE INJECTION AND TRANSPORT LAYERS

RELATED APPLICATIONS

This application is a continuation of U.S. patent application Ser. No. 12/605,768, filed Oct. 26, 2009, which claims priority to U.S. provisional application Ser. No. 61/108,844 filed Oct. 27, 2008 to Mathai et al., which are hereby incorporated by reference in their entirety.

BACKGROUND

Although useful advances are being made in organic electronic devices such as organic photovoltaic devices (OPVs) and organic electroluminescent devices (including organic light emitting diodes (OLEDs), polymer light emitting diodes (PLEDs), and phosphorescent organic light emitting diodes (PHOLEDs)), further improvements are needed in the processing, manufacture and performance these devices. In particular, improvements in technologies for hole injection and/or hole transport in these devices is especially desirable. State of the art organic electronic devices generally still can use hole injection layers (HILs) and/or hole transport layers (HTLs) within the device to optimize charge flow through the device, separation, or recombination of electrons and holes. Hole injection layers and hole transport layers can present difficult problems because of the solubilities of the component materials (or lack their of) in processing solvents, and because of the dopants and/or acids needed for HIL or HTL performance. Dopants and acids should be chosen judicially to minimize their contributions to device degradation.

A need exists for improved hole injection and charge transport materials that can enhance the performance of organic electronic devices, producing increased efficiencies, brightness and lifetimes. A need also exists for improved hole injection and transport materials that can be adapted for different applications and can function with a variety of different light emitting layers, photoactive layers, and electrodes.

SUMMARY

Compositions for use in hole transporting layers (HTLs) or hole injection layers (HILs) are provided, as well as methods of making and using the compositions and devices fabricated from the compositions.

The compositions can comprise at least one conductive conjugated polymer, at least one semiconducting matrix component that is different from the conductive conjugated polymer, and an optional dopant, and can be substantially free of an insulating matrix component. The compositions can produce improved HILs and HTLs that, when incorporated into electronic devices such as OLEDs or OPVs, can lead to increases in the performance of the devices.

Thus, in some aspects, a composition is provided comprising (a) at least one conductive conjugated polymer, (b) at least one semiconducting matrix component that is different from the conductive conjugated polymer in (a), and (c) optionally, at least one dopant, wherein the composition is substantially free of an insulating matrix component.

In other aspects, a composition is provided comprising (a) at least one conductive conjugated polymer; (b) at least one semiconducting matrix component that is different from the conductive conjugated polymer in (a); (c) a solvent; and (d) optionally, at least one dopant; wherein the composition is substantially free of an insulating matrix component.

In some aspects, a method is provided for preparing a composition, the method comprising: (a) combining the conductive conjugated polymer, the dopant, and the solvent to form a doped conductive polymer solution; and (b) adding the semiconducting matrix component to the doped conductive polymer solution to form the composition.

In some aspects, a device is provided comprising a hole transport layer or a hole injection layer comprising: (a) at least one conductive conjugated polymer; (b) at least one semiconducting matrix component that is different from the conductive conjugated polymer in (a); and (c) optionally, at least one dopant; wherein the hole transport layer or a hole injection layer is substantially free of an insulating matrix component.

In yet other aspects, a method is provided for improving the efficiency of an organic electronic device, the method comprising: providing a hole transport layer or hole injection layer comprising (a) at least one conductive conjugated polymer, (b) at least one semiconducting matrix component that is different from the conductive conjugated polymer in (a), and (c) optionally, at least one dopant, wherein the hole transport layer or hole injection layer is substantially free of an insulating matrix component; and incorporating the hole transport layer or hole injection layer into the organic electronic device; wherein incorporation of the hole transport layer or hole injection layer into the organic electronic device leads to an increase in device efficiency of at least 5%.

At least one advantage for at least one embodiment is improved device lifetime.

At least one advantage for at least one embodiment is improved combinations of device properties, including device performance and/or device lifetime.

At least one additional advantage for at least one embodiment is improved formulation flexibility.

BRIEF DESCRIPTION OF THE FIGURES

FIG. 1 presents UV-vis-NIR absorbance spectra of the five HIL ink formulations of Example 1.

DETAILED DESCRIPTION

Introduction

All references cited herein are incorporated by reference in their entireties.

The compositions provided herein can comprise at least one conductive conjugated polymer, at least one semiconducting matrix component that is different from the conductive conjugated polymer in (a), and an optional dopant, and are substantially free of an insulating matrix component. The compositions can be used to form improved HTLs or HILs that, when incorporated into electronic devices such as OLEDs or OPVs, result in increased device performance. For example, the compositions include ink formulations that can be used to form HILs in OLEDs. OLEDs constructed with the compositions can exhibit increases in efficiency and brightness. The present compositions thus can provide an improved hole injection technology that can be used in applications involving organic electroluminescence, in particular, in OLEDs and other lighting displays and/or applications.

In the compositions, the conductive conjugated polymer and the semiconductive matrix component are typically in admixture with one another, forming a blended composition that, when present as either an HIL or HTL layer in a device, permits charge injection to take place throughout the bulk of the layer rather than at the surface of the layer.

The compositions can also contain a dopant that functions as a doping agent for either the conductive or the semiconducting polymer or both. Doping of both the conductive and semiconducting polymers enables rapid charge transport through the bulk of the present compositions when incorporated into an organic electronic device, increasing the performance of the device. The highly conductive doped polymers of the compositions produce HILs or HTLs having high conductivities, which lower the series resistance of organic electronic devices. This is in contrast to other hole injection technologies which produce HILs or HTLs having much lower conductivities (and, as a consequence, devices with higher series resistance).

In some embodiments, the compositions produce HILs or HTLs that are substantially transparent to visible light, even if the thickness of the layer is higher than usual, for example, on the order of 60 nm to 200 nm. For example, the HIL or HTL can transmit about 85% to about 90% or greater (i.e., %T>85-90%) of light having a wavelength of about 400-800 nm. Thus, an additional advantage of the present compositions can be the formation of substantially transparent HILs or HTLs having moderately high thicknesses. Thick HILs or HTLs can also be used to eliminate shorts in semiconductor devices without adversely impacting operating voltage.

Insulating Matrix Component

Traditionally, organic electronic devices such as OLEDs are fabricated using HILs or HTLs containing a conductive polymer and one or more insulating polymers, such as polystyrene sulfonic acid (PSS) and nafion. Insulating polymers are typically used as the matrix component in HILs or HTLs, forming form the bulk of these layers. Examples of insulating polymers that can be used as HIL/HTL matrix components include poly(styrene) or poly(styrene) derivatives, poly(vinyl acetate) or its derivatives, poly(ethylene glycol) or its derivatives, poly(ethylene-co-vinyl acetate), poly(pyrrolidone) or its derivatives (e.g., poly(1-vinylpyrrolidone-co-vinyl acetate)), poly(vinyl pyridine) or its derivatives, poly(methyl methacrylate) or its derivatives, poly(butyl acrylate) or its derivatives. The use of insulating polymers in HILs or HTLs are described more fully in U.S. Pat. Appl. Publ. No. 2006/0175582, by Hammond et al. Insulating polymers typically possess a band gap greater than 3 eV.

In contrast, the semiconducting matrix component of the present invention is used in place of the insulating polymer matrix component of traditional HILs or HTLs. The present compositions are substantially free of an insulating matrix component. Typically, the present compositions contain less than about 5% (w/w), less than about 3% (w/w), less than about 2% (w/w), less than about 1% (w/w), less than about 0.5%(w/w), less than about 0.25% (w/w), less than about 0.1% (w/w), less than about 0.01% (w/w), or less than about 0.001% (w/w) of an insulating matrix component. Weight percentages are calculated on the basis of the weight of all solids in the composition.

For example, when in the form of ink formulations, the present compositions typically contain less than about 3% (w/w), less than about 2% (w/w), less than about 1% (w/w), or less than about 0.5% (w/w) of an insulating matrix component. Typically, an ink formulation can contain from about 0.5% (w/w) to about 3.0% (w/w), about 0.5% (w/w) to about 2.0% (w/w), about 0.5% (w/w) to about 1.0% (w/w) of an insulating matrix component.

Conductive Conjugated Polymers

The present compositions comprise at least one conductive conjugated polymer.

Electrically conductive conjugated polymers and their use in organic electronic devices are known in the art. See, for example, Friend, "Polymer LEDs," *Physics World*, November 1992, 5, 11, 42-46. See also Kraft et al., "Electroluminescent Conjugated Polymers-Seeing Polymers in a New Light," *Angew. Chem. Int. Ed.* 1998, 37, 402-428.

Electrically conductive conjugated polymers are also described in *The Encyclopedia of Polymer Science and Engineering*, Wiley, 1990, pages 298-300, which is hereby incorporated by reference in its entirety. This reference describes conductive conjugated polymers, including polyacetylene, poly(p-phenylene), poly(p-phenylene sulfide), polypyrrole, and polythiophene, as well as blending and copolymerization of polymers, including block copolymer formation, and discloses conductive conjugated polymers that can be used in the present compositions. See also Groenendaal et al., *Adv. Materials* 15:855-879 (2003); Patil et al., *Chem. Rev.* 88:183-200 (1988); Roncali, J., *Chem. Rev.* 97:173-205 (1997); and Yamamoto and Hayashida, *Reactive & Functional Polymers* 37:1-17 (1998).

Examples of conductive conjugated polymers suitable for use in the present compositions also include those disclosed in, e.g., Seshadri, V., and Sotzing, G., "Progress in Optically Transparent Conducting Polymers," Chpt. 22, in *Organic Photovoltaics*, Sun and Sariciftci, eds., CRC Press, 2005, pp. 495-527.

In some embodiments, the conductive polymer comprises a conductive heterocyclic conjugated polymer. Suitable heterocyclic conjugated polymers include, for example, polythiophene polymers. Conductive heterocyclic conjugated polymers suitable for use in the present formulations and devices can be obtained from Plextronics, Inc., Pittsburgh, Pa., including, for example, polythiophene-based polymers such as Plexcore® and similar materials.

Polythiophenes are described, for example, in Roncali, J., *Chem. Rev.* 1992, 92, 711; Schopf et al., *Polythiophenes: Electrically Conductive Polymers*, Springer: Berlin, 1997. See also for example U.S. Pat. Nos. 4,737,557 and 4,909,959. In addition, synthetic methods, doping, and polymer characterization, including regioregular polythiophenes with side groups, is provided in, for example, U.S. Pat. No. 6,602,974 to McCullough et al. and U.S. Pat. No. 6,166,172 to McCullough et al., which are hereby incorporated by reference in their entireties. Additional description can be found in the article, "The Chemistry of Conducting Polythiophenes," by Richard D. McCullough, *Adv. Mater.* 1998, 10, No. 2, pages 93-116, and references cited therein, which is hereby incorporated by reference in its entirety. Another reference which one skilled in the art can use is the *Handbook of Conducting Polymers*, $2^{nd}$ Ed. 1998, Chapter 9, by McCullough et al., "Regioregular, Head-to-Tail Coupled Poly(3-alkylthiophene) and its Derivatives," pages 225-258, which is hereby incorporated by reference in its entirety. This reference also describes, in chapter 29, "Electroluminescence in Conjugated Polymers" at pages 823-846, which is hereby incorporated by reference in its entirety. Polymeric semiconductors are described in, for example, "Organic Transistor Semiconductors" by Katz et al., *Accounts of Chemical Research*, vol. 34, no. 5, 2001, page 359 including pages 365-367, which is hereby incorporated by reference in its entirety.

Conductive conjugated polymers suitable for use in the present compositions can be in the form of homopolymers, copolymers, or block copolymers. Block copolymers are described in, for example, *Block Copolymers, Overview and Critical Survey*, by Noshay and McGrath, Academic Press, 1977. For example, this text describes A-B diblock copolymers (chapter 5), A-B-A triblock copolymers (chapter 6), and $-(AB)_n$- multiblock copolymers (chapter 7), which can form the basis of block copolymer types as described herein. Additional block copolymers, including polythiophenes, are also described in, for example, Francois et al., *Synth. Met.* 1995, 69, 463-466, which is incorporated by reference in its entirety; Yang et al., *Macromolecules* 1993, 26, 1188-1190; Widawski et al., *Nature (London)*, vol. 369, Jun. 2, 1994, 387-389; Jenekhe et al., *Science,* 279, Mar. 20, 1998, 1903-1907; Wang et al., *J. Am. Chem. Soc.* 2000, 122, 6855-6861; Li et al., *Macromolecules* 1999, 32, 3034-3044; and Hempenius et al., *J. Am. Chem. Soc.* 1998, 120, 2798-2804.

In some embodiments, the conductive conjugated polymer comprises a regioregular conjugated polymer. In particular, the conductive conjugated polymer can comprise a heterocyclic conjugated polymer that is regioregular, including, for example, a regioregular polythiophene polymer.

Regioregularity can arise in multiple ways. For example, it can arise from polymerization of asymmetric monomers such as a 3-alkylthiophene to provide a head-to-tail (HT) poly(3-substituted)thiophene. Alternatively, it can arise from polymerization of monomers which have a plane of symmetry between two portions of monomer, such as, for example, a bi-thiophene, providing, for example, regioregular HH-TT and TT-HH poly(3-substituted)thiophenes.

The following article describes several types of regioregular systems beginning at page 97 and references cited therein: "The Chemistry of Conducting Polythiophenes," by Richard D. McCullough, *Adv. Mater.* 1998, 10, No. 2, pages 93-116. In a regioregular polymer, including a polythiophene derivative, the degree of regioregularity can be, for example, about 90% or more, or about 95% or more, or about 98% or more, or about 99% or more. Methods known in the art such as, for example, NMR can be used to measure the degree of regioregularity. In some embodiments, the degree of regioregularity is greater than about 75%. In other embodiments, the degree of regioregularity is between about 85% and 100%.

In other embodiments, the conductive conjugated polymer comprises a heterocyclic conjugated polymer that is relatively regioirregular. For example, the degree of regioregularity can be about 90% or less, or about 80% or less, or about 70% or less, or about 60% or less, or about 50% or less.

Polythiophene polymers suitable for use in the present compositions and devices can also be star shaped polymers, with the number of branches being, for example, more than three and comprising thiophene units. Polythiophene polymers can also be dendrimers. See, for example, Anthopoulos et al., *Applied Physics Letters,* 82, 26, Jun. 30, 2003, 4824-4826.

In some embodiments, the conductive conjugated polymer comprises a regioregular 3-substituted polythiophene, including, for example, a regioregular HH-TT or TT-HH poly(3-substituted)thiophene such as a HH-TT or TT-HH poly(3-polyether)thiophene. Examples of conductive conjugated polymers suitable for use in the present compositions are described in U.S. provisional Appl. No. 61/044,380, filed Apr. 11, 2008, by Seshadri et al., entitled "Doped Conjugated Polymers, Devices, and Methods of Making Devices," (and also U.S. patent application Ser. No. 12/422,159 filed Apr. 10, 2009), which are herein incorporated by reference in their entirety. Additional examples of suitable conductive conjugated polymers are described in Williams et al., U.S. provisional Appl. No. 61/043,654, filed on Apr. 9, 2008, by Williams et al., entitled "Hole collection Layer Compositions and Photovoltaic Devices"; U.S. Pat. Publ. No. 2006/0175582 A1, by Hammond et al., entitled "Hole Injection/Transport Layer Compositions and Devices"; U.S. Pat. Publ. No. 2008/0216894 A1 by T. Hammond, entitled "Quantum Dot Photovoltaic Device"; and in Marks et al., U.S. Patent Application Pub. No. 2005/0147846 A1. Each of these patent applications and publications is hereby incorporated by reference in its entirety.

For example, in some embodiments of the present compositions, the conductive conjugated polymer comprises a 3,4-disubstituted polythiophene, including, for example, a poly(3,4-dialkoxythiophene) or a poly(3,4-di-polyether)-thiophene. 3,4-disubstituted polythiophenes suitable for use in the present compositions, and methods of synthesis and use in electronic devices, are described in U.S. provisional Appl. No. 61/044,380, filed Apr. 11, 2008, by Seshadri et al., as described above.

Examples of poly(3,4-dialkoxy)thiophenes and poly(3,4-di-polyether)-thiophenes include, but are not limited to, poly(3,4-bis(2-(2-butoxyethoxy)ethoxy)thiophene)-2,5-diyl, poly(3,4-bis(2-(2-ethoxyethoxy)ethoxy)thiophene)-2,5-diyl; poly(3,4-bis(2-(2-methoxyethoxy)ethoxy)thiophene)-2,5-diyl; poly(3,4-bis(2-(2-butoxyethoxy)ethoxy)thiophene)-2,5-diyl; poly(3,4-bis(2-(2-butoxybutoxy)butoxy)thiophene)-2,5-diyl; and poly(3,4-bis(2-(2-methoxymethoxy)methoxy)thiophene)-2,5-diyl.

For example, in some embodiments, the conductive polymer comprises poly(3,4-bis(2-(2-butoxyethoxy)ethoxy) thiophene (PDBEETh), represented by:

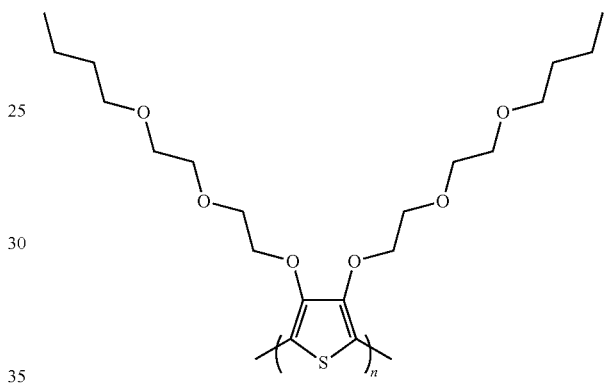

The degree of polymerization n of the conductive conjugated polymer is not particularly limited, but can be, for example, 2 to 500,000 or 5 to 100,000 or 10 to 10,000, or 10 to 1,000, or 10 to 100. In some embodiments, the conductive polymer has a number average molecular weight between approximately 5,000 and 100,000 g/mol.

The conductive conjugated polymer can be in either the neutral or oxidized state, and is typically soluble and/or dispersible in an organic solvent. For example, in some embodiments, the conjugated polymer is soluble in tetrahydrofuran (THF), chloroform, acetonitrile, cyclohexanone, anisole, chlorobenzene, o-dichlorobenzene, ethyl benzoate and mixtures thereof. Thus, in some embodiments, the conductive conjugated polymer is in a non-aqueous formulation.

In other embodiments, the conductive conjugated polymer is in an aqueous formulation. Examples of such aqueous formulations include aqueous formulations of sulfonated polythiophenes as the conductive conjugated polymers. See, e.g., U.S. Pat. Publ. No. 2008/0248313, by Seshadri et al., entitled "Sulfonation of Conducting Polymers and OLED, Photovoltaic, and ESD Devices," which is incorporated by reference herein in its entirety. Self-doped conductive conjugated polymers are also contemplated for the present compositions.

Additional embodiments are described in, for example, (i) U.S. provisional application Ser. No. 61/108,851 filed Oct. 27, 2008; and (ii) U.S. provisional application Ser. No. 61/115,877 filed Nov. 18, 2008.

In the present compositions, the conductive conjugated polymer upon doping typically possesses a band gap less than 1 eV or essentially no band gap.

The conductive conjugated polymer may also be a semiconductive polymer, as described below, that has been doped to provide for an effective band gap or about 0 eV.

Semiconducting Matrix Component

The present compositions also comprise at least one semiconducting matrix component. The semiconducting matrix component is different from the conductive conjugated polymer in the compositions.

The semiconducting matrix component can be a semiconducting small molecule, such as a hole transporting compound, or a semiconducting polymer that is typically comprised of repeat units comprising hole transporting units in the main-chain and/or in a side-chain. The semiconducting matrix component may be in the neutral form or may be doped, and is typically soluble in organic solvents, such as toluene, chloroform, THF, acetonitrile, cyclohexanone, anisole, chlorobenzene, o-dichlorobenzene, ethyl benzoate and mixtures thereof.

Examples of semiconducting small molecules and polymers suitable for use as matrix components are described by Marks et al., in U.S. Patent Application Pub. No. 2005/0147846 A1, entitled "Hole Transport Layer Compositions and Related Diode Devices," which is hereby incorporated by reference in its entirety.

Examples of small molecules suitable as for use as the semiconducting matrix component include, but are not limited to, hole transporting compounds. Suitable hole transporting compounds, include, for example, triarylamines. Examples of useful triarylamines include 1,4-bis(diphenylamino)benzene, represented by:

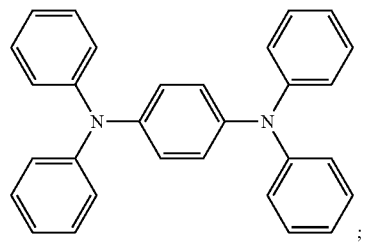 [SMILES: c1ccc(N(c2ccccc2)c2ccc(N(c3ccccc3)c3ccccc3)cc2)cc1 ; ";"]

N—N'-bis(3-methylphenyl)-N—N'-bis(phenyl)benzidine (TPD), represented by:

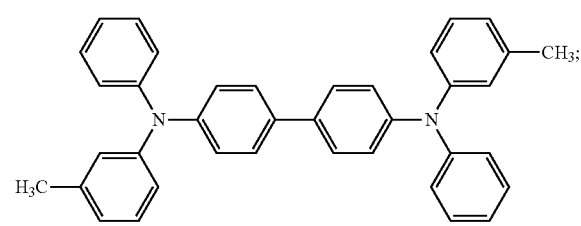 [SMILES: Cc1cccc(N(c2ccccc2)c2ccc(-c3ccc(N(c4ccccc4)c4cccc(C)c4)cc3)cc2)c1]

N—N'-bis(4-methylphenyl)-N—N'-bis(phenyl)benzidine, represented by:

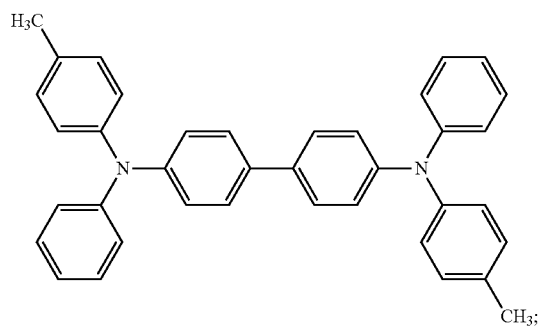 [SMILES: Cc1ccc(N(c2ccccc2)c2ccc(-c3ccc(N(c4ccccc4)c4ccc(C)cc4)cc3)cc2)cc1]

N—N'-bis(2-naphthalenyl)-N—N'-bis(phenyl)benzidine, represented by:

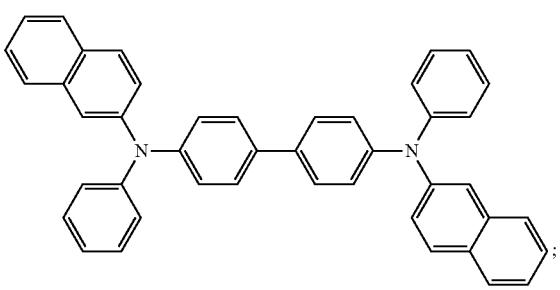 [SMILES: c1ccc(N(c2ccc(-c3ccc(N(c4ccccc4)c4ccc5ccccc5c4)cc3)cc2)c2ccc3ccccc3c2)cc1]

1,3,5-tris(3-methyldiphenyl amino)benzene, represented by:

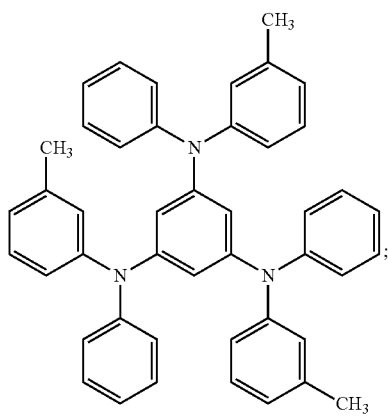 [SMILES: Cc1cccc(N(c2ccccc2)c2cc(N(c3ccccc3)c3cccc(C)c3)cc(N(c3ccccc3)c3cccc(C)c3)c2)c1]

and 1,3,5-tris[(3-methylphenyl)phenylamino]benzene, represented by:

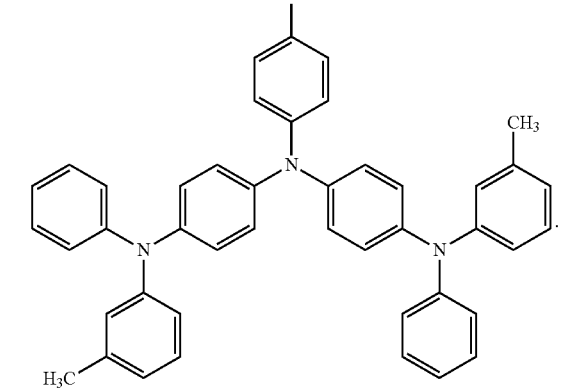

Other suitable hole transporting compounds that can be used as semiconducting matrix compounds include, but are not limited to, tri-p-tolylamine, represented by:

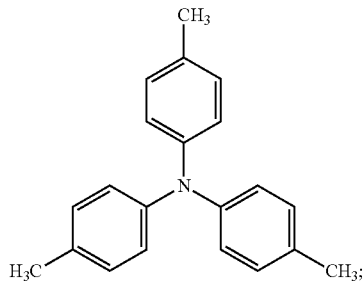 [SMILES: Cc1ccc(N(c2ccc(C)cc2)c2ccc(C)cc2)cc1]

N—N'-bis(1-naphthalenyl)-N—N'-bis(phenyl)benzidine (NPB), represented by:

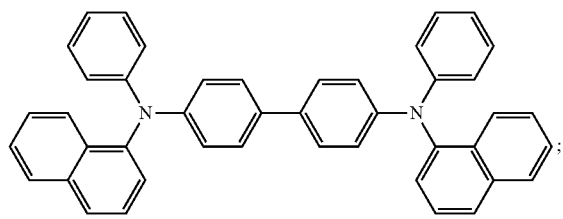 [SMILES: c1ccc(N(c2ccc(-c3ccc(N(c4ccccc4)c4cccc5ccccc45)cc3)cc2)c2cccc3ccccc23)cc1]

4,4',4''-tris(N—N-phenyl-3-methylphenylamino)triphenylamine, represented by:

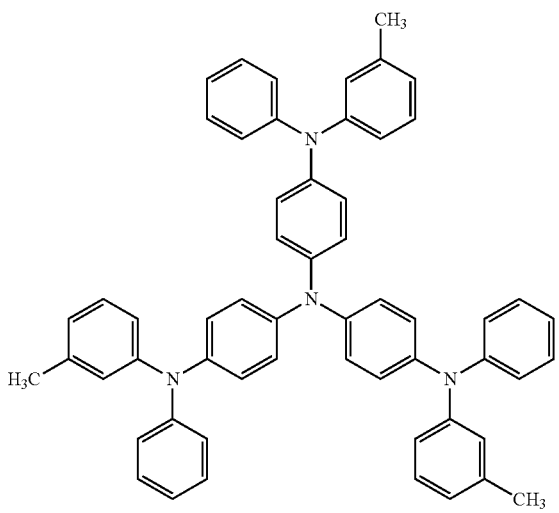

1,3,5-tris(diphenylamino)benzene, represented by:

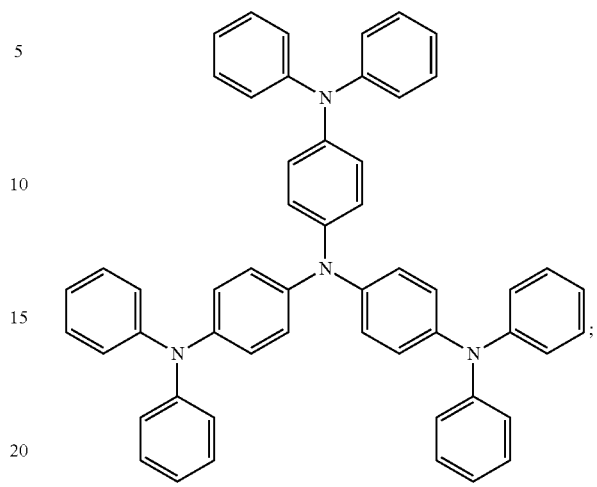

N,N'-bis(3-methylphenyl)-N,N'-diphenylbenzidine, represented by:

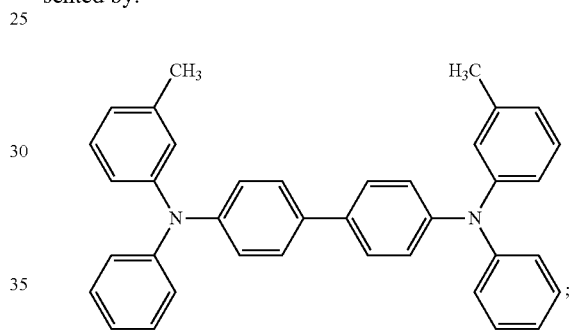

4-(diethylamino)benzaldehyde diphenylhydrazone, represented by:

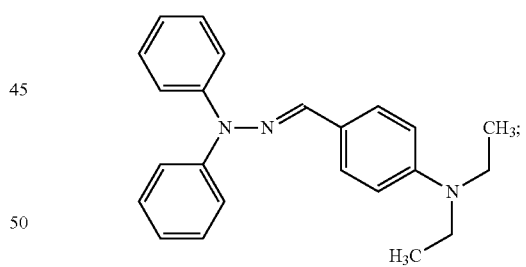

4-(dimethyl amino)benzaldehyde diphenylhydrazone, represented by:

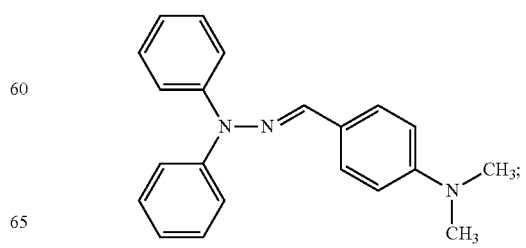

4-(dimethylamino)benzaldehyde diphenylhydrazone, represented by:

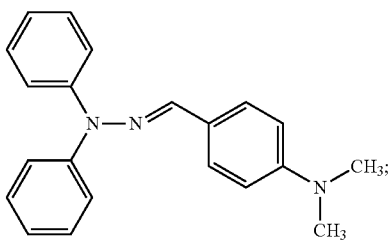 [SMILES: CN(C)c1ccc(/C=N/N(c2ccccc2)c2ccccc2)cc1]

4-(diphenylamino)benzaldehyde diphenylhydrazone, represented by:

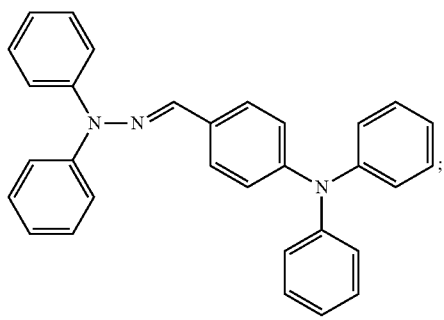 [SMILES: C(=N\N(c1ccccc1)c1ccccc1)/c1ccc(N(c2ccccc2)c2ccccc2)cc1]

4-(dibenzylamino)benzaldehyde-N,N-diphenylhydrazone, represented by:

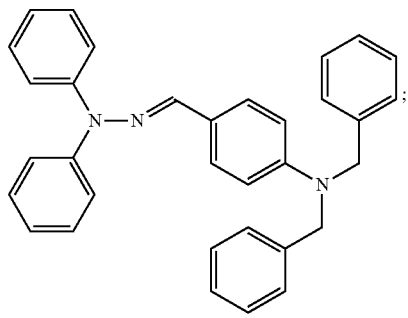 [SMILES: C(=N\N(c1ccccc1)c1ccccc1)/c1ccc(N(Cc2ccccc2)Cc2ccccc2)cc1]

and
tris[4-(diethylamino)phenyl]amine, represented by:

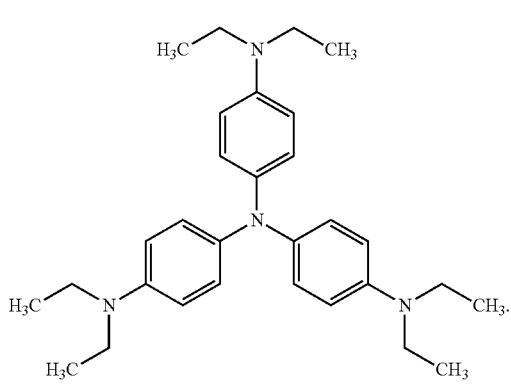 [SMILES: CCN(CC)c1ccc(N(c2ccc(N(CC)CC)cc2)c2ccc(N(CC)CC)cc2)cc1]

Additional suitable hole transporting compounds include those based on, or comprising, one or more carbazole units, such as, for example, tris(4-carbazoyl-9-ylphenyl)amine (TCTA); 4,4'-bis(carbazol-9-yl)-1,1'-biphenyl (CBP, or 4,4', N,N'-diphenylcarbazole), represented by:

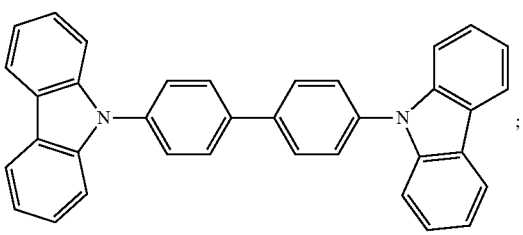 [SMILES: c1ccc2c(c1)c1ccccc1n2-c1ccc(-c2ccc(-n3c4ccccc4c4ccccc43)cc2)cc1]

9-ethyl-3-carbazolecarboxaldehyde diphenylhydrazone, represented by:

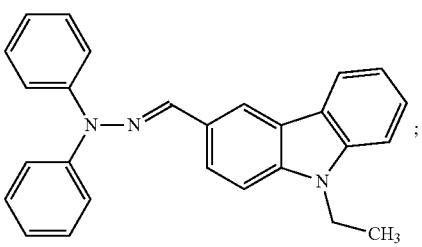 [SMILES: CCn1c2ccccc2c2cc(/C=N/N(c3ccccc3)c3ccccc3)ccc21]

1,3,5-tris(2-(9-ethylcabazyl-3)ethylene)benzene, represented by:

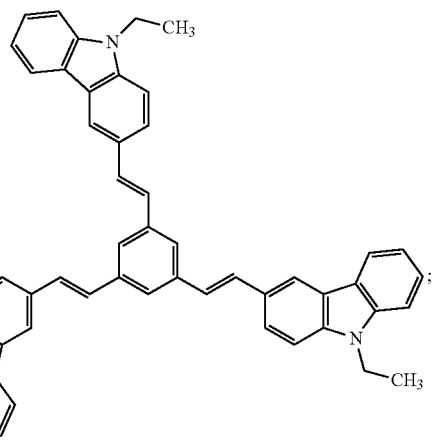

and tris(4-carbazoyl-9-ylphenyl)amine, represented by:

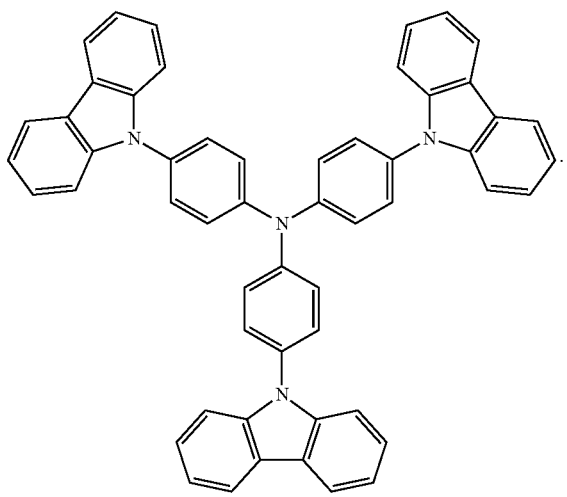 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1]

Other suitable semiconducting matrix compounds include porphyrinic metal complexes, such as, for example, copper (II) phthalocyanine, represented by:

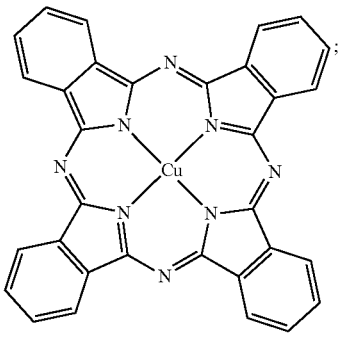

and
titanyl phthalocyanine, represented by:

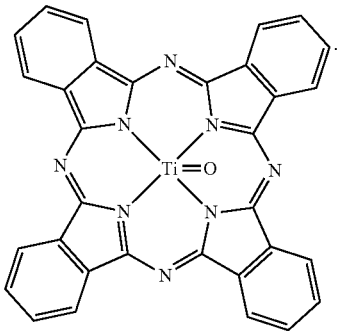

Other small molecules suitable as for use as the semiconducting matrix component include polycyclic aromatic compounds such as anthracene, naphthalene, and fluorene.

The semiconducting matrix component can also comprise a polymer having one or more repeat units comprising a semiconducting small molecule such as, for example, a hole transport compound, or a polymer having one or more repeat units comprising one of the semiconducting small molecules described above.

Such polymers include, for example, polymers comprised of repeat units comprising hole transporting compound units in the main-chain and/or in a side-chain, such as poly-TPD, poly-N,N'-di(naphthalene-1-yl)-N,N'-diphenyl-benzidine (poly-NPD), polyvinylcarbazole (PVK), and similar polymers.

Additional examples of suitable polymers include the polyarylamine ketone polymers disclosed in U.S. Provisional Appl. No. 61/108,851, entitled "Polyarylamine Ketones," by Seshadri et al., filed on Oct. 27, 2008, which is herein incorporated by reference in its entirety. See also, U.S. provisional 61/115,877 filed Nov. 18, 2008.

Also suitable are polymers having one or more repeat units comprising polycyclic aromatic compound units in the main-chain and/or in a side-chain, including, for example, polyaromatic polymers or polyvinyl aromatic polymers such as polyvinyl naphthalene, polyvinyl anthracene, polyanthracene, or fluorene-based polymers.

Examples of suitable fluorene-based polymers include, but are not limited to, poly[(9,9-dihexylfluorenyl-2,7-diyl)-co-(N—N'-bis{p-butylphenyl}-1,4-diamino-phenylene)], sold by American Dye Source, Inc. (Baie D'Urfe, Quebec, Canada) as ADS250BE, represented by:

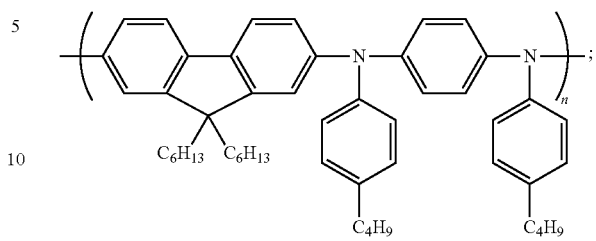

and
poly[(9,9-dioctylfluorenyl-2,7-diyl)-co-(N—N'-bis{4-butylphenyl}-1,1'-byphenylene-4,4-diamine)], represented by:

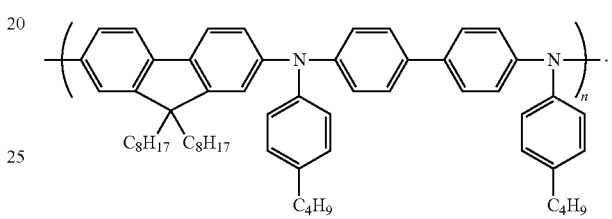

Examples of additional polymers suitable for use as the semiconducting matrix polymer include poly(N,N'-bis(4-butylphenyl)-N,N'-bis(phenyl)benzedine, represented by:

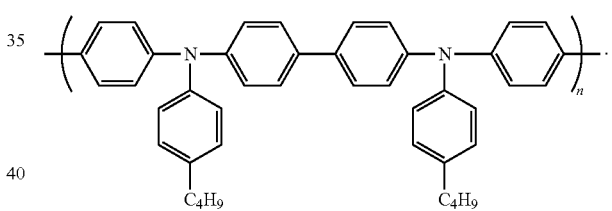

and
poly(copper phthalocyanine), represented by:

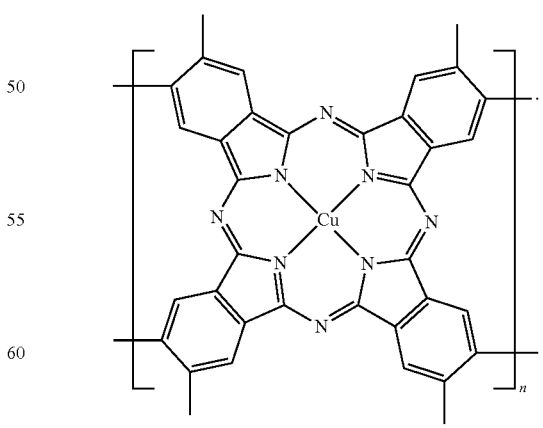

In the present compositions, the semiconducting matrix component typically possesses a band gap of less than 3 eV, e.g., a band gap from about 1 eV to about 3 eV.

Dopants

The present compositions optionally comprise one or more dopants.

Dopants are typically used to obtain a desired conductive state for a polymer component of an HIL or HTL and often result in improved device performance. For example, upon oxidation of a conjugated conductive polymer by a redox dopant, electrons are removed from the valence band of the conductive polymer. This change in oxidation state results in the formation of new energy states for the polymer. The energy levels are accessible to some of the remaining electrons in the valence band, allowing the polymer to function as a conductor.

In the present compositions, in particular, the conductive conjugated polymer can be doped with a redox dopant. Examples of suitable redox dopants that are known in the art include, but are not limited to, quinones, boranes, carbocations, bora-tetraazapentalenes, aminium or ammonilium salts, sulfonium salts, oxonium salts, selenonoium salts, nitrosonium salts, arsonium salts, phosphonium salts, iodonium salts, select metal (e.g. silver) salts, or combinations thereof Suitable redox dopants include, but not limited to, those disclosed in U.S. Pat. Nos. 5,853,906 and 5,968,674, which are hereby incorporated by reference in their entireties.

The redox dopant can also be selected to provide a suitable charge balancing counter-anion. The type of dopant anion can affect the doping level of the conductive polymer and the device performance for devices prepared from these solutions.

The size of the dopant anion can be an important parameter for enhancing the efficiency of a device. The anion can be a borate anion, a hexafluorophosphate anion, antimoniate, a sulfonate anion, a chloride anion, a bromide anion, an iodide anion, a tetrafluoroborate anion, a hexafluorophosphate anion, an optionally substituted arylsulfonate anion, an optionally substituted alkylsulfonate anion, a perfluoroalkylsulfonate anion, an optionally substituted tetraarylborate anion, or an optionally substituted tetraalkylborate anion.

In the final compositions, the composition can be distinctly different from the combination of original components (i.e., conductive polymer and/or redox dopant may or may not be present in the final composition in the same form before mixing). Thus, the conductive conjugated polymer and the dopant, or redox dopant, can refer to components that will react to form a doped conductive conjugated polymer. In addition, some embodiments allow for removal of reaction byproducts from the doping process. For example, the iodonium redox dopant can result in organic byproducts that can be washed away from the doped polymer.

In some embodiments, the redox dopant is a photoacid. Examples of suitable photoacids include, but are not limited to, onium salts such as sulfonium and iodonium salts, for example, as described in *Journal of Polymer Science Part A, Polymer Chem.* 37, 4241-4254, 1999, hereby incorporated by reference in its entirety.

Iodonium salts are known in the art. Doping of a conductive polymer, such as a neutral polythiophene, can be achieved using photoacids such as iodonium salts or diaryl iodonium salts, and in particular, diphenyl iodonium salts.

The aryl groups such as a phenyl group in the iodonium salt can be optionally substituted as known in the art. For example, the redox dopant may be a lipophilic iodonium salt. Typically, the iodonium salt is represented by:

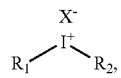

wherein independently $R_1$ is an optionally substituted aryl group, independently $R_2$ is an optionally substituted aryl group, and $X^-$ is an anion.

Doping of a neutral polythiophene can also be achieved using a photoacid such as a sulfonium salt. Sulfonium salts are known in the art. The aryl groups in the sulfonium salt can be optionally substituted as known in the art. Typically, the sulfonium salt is represented by:

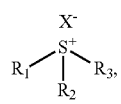

wherein independently $R_1$ is an optionally substituted arene, independently $R_2$ is a optionally substituted arene, $R_3$ is a optionally substituted arene, and $X^-$ is an anion.

The dopant can comprise an optionally substituted diphenyl iodonium salt with a molecular weight of, for example, about 100 g/mol to about 500 g/mol, or approximately 300 g/mol.

In some embodiments, the dopant is the photoacid 4-isopropyl-4'-methyldiphenyliodonium tetrakis(pentafluorophenylborate) (IMDPIB(PhF$_5$)$_4$), represented by:

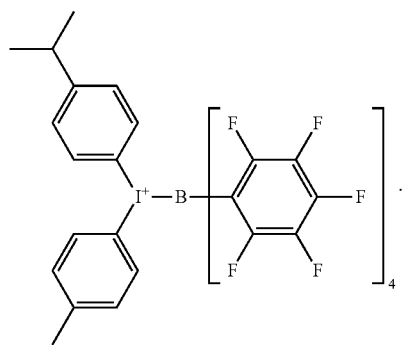

Examples of other iodonium salts that may be used, include, but are not limited to, diphenyliodonium hexafluorophosphate (DPIPF$_6$), diphenyliodonium para-toluene sulfonate (DPITos), bis-(4-tert-butylphenyl) iodonium trifluoromethane sulfonate (ᵗBDPITFSO$_3$), and diphenyliodonium perfluoro-1-butane sulfonate (DPIPFBSO$_3$). The iodonium salt can be a low molecular weight compound or it can be coupled to a high molecular compound such as a polymer.

The redox dopant may be a sulphonium salt. Examples of suitable sulphonium salts include, but are not limited to, triphenylsulphonium hexafluorophosphate, triphenylsulphonium para-toluene sulfonate, bis-(4-tert-butylphenyl) sulphonium trifluoromethane sulfonate, and diphenylsulphonium perfluoro-1-butane sulfonate.

Other onium salts may be used provided such that effective doping can be achieved for select counterions.

Another class of dopants that can be used includes quinones. Examples of suitable quinones that may be used to effect doping include, but are not limited to, tetrafluorotetracyano-p-quinodimethane (F$_4$TCNQ), trifluorotetracyano-p-quinodimethane (F$_3$TCNQ), difluorotetracyano-p-quinodimethane (F$_2$TCNQ), fluorotetracyano-p-quinodimethane (FTCNQ), dichloro dicyanoquinine (DDQ), o-chloranil and cyanil.

Further examples of suitable dopants include quinonediimine derivatives, including, e.g., those disclosed in U.S. Pat. No. 6,908,783 by Kuehl et al., which is incorporated by reference herein in its entirety.

Another class of dopants that can be used includes aminium salts. Aminium radical cations can be used as a redox additive to the formulation to undergo electron transfer. The byproducts formed need not necessarily be removed from the composition, as they are also hole transporting moieties and are less likely to adversely affect transport. Examples of suitable aminium salts include, but are not limited to, tris-(4-bromophenyl)aminium hexachloroantimonate).

Other useful redox dopants include bora-tetraazapentalenes. Examples of a bora-tetraazapentalene are represented by:

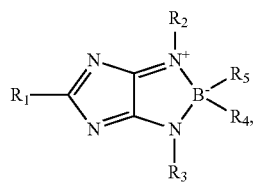

wherein R$_1$, R$_2$, R$_3$ are independently hydrogen, an optionally substituted or unsubstituted alkyl, a heteroalkyl, an aryl, a heteroaryl, a fused carbocycle or a fused heterocycle group, and wherein independently R$_4$ and R$_5$ are a halogen, hydrogen, an optionally substituted or unsubstituted alkyl, a heteroalkyl, an aryl, a heteroaryl, a fused carbocycle or fused heterocycle, or, together with the boron atom, a boron-containing heterocycle. (See, e.g., Rothe, Carsten, Laser and Photonics Reviews (2007), 1(4), 303-306; and WO 2007115540 A1 (published 2007-10-18), and references therein.)

Another class of useful dopants is a silver salt, such as silver tetrafluoroborate, silver tetraphenylborate, silver hexafluorophosphate. Silver ions may undergo electron transfer to or from silver metal and the conductive polymer salt. See, e.g., U.S. Pat. Nos. 5,853,906 and 5,968,674.

In preparing the present compositions, the dopant is typically formulated first with the conductive polymer, to ensure that doping of the conducting polymer occurs. The semiconducting matrix component is then added.

For example, in some embodiments, the composition is an ink formulation that is prepared by combining the conductive conjugated polymer with the dopant to form a conductive polymer-dopant mixture. Typically, a stock solution of the conductive conjugated polymer (e.g., one made by dissolving or dispersing the conductive polymer in an organic solvent) is combined with a stock solution of the dopant, to form a polymer-dopant solution. A stock solution of the semiconducting matrix component is then added to the conducting polymer-dopant solution to form the ink formulation.

Alternatively, in some embodiments, the dopant is covalently attached to the conductive conjugated polymer. In these embodiments, the compositions are prepared by combining the conductive polymer-dopant with the semiconducting matrix component to form the composition.

Amounts

The present compositions can comprise between about 1% and 99% by weight ("wt %," or "% (w/w)") of the conductive conjugated polymer, between about 1% and 99% by weight of the semiconducting matrix component, and, if a dopant is present, between about 0% and 75% by weight dopant. Weight percentages for each component are calculated on the basis of the weight of all solids in the composition.

For example, in some embodiments, the compositions comprise about 10% to about 90%, about 15% to about 80%, about 25% to about 75%, about 30% to about 70%, or about 35% to about 65% by weight of the conductive conjugated polymer with respect to the total amount of conductive polymer, semiconducting matrix component, and dopant, if present.

In some embodiments, the compositions comprise about 10% to about 90%, about 15% to about 80%, about 25% to about 75%, about 30% to about 70%, or about 35% to about 65% by weight of the semiconducting matrix component with respect to the total amount of conductive conjugated polymer, semiconducting matrix component, and dopant, if present. In other embodiments, the compositions comprise about 10% to about 50%, about 10% to about 40%, about 10% to about 30%, or about 10% to about 20% by weight of the semiconducting matrix component.

In some embodiments, the compositions comprise about 20% to about 80%, about 25% to about 75%, or about 25% to about 50%, by weight of the dopant with respect to the total amount of conductive conjugated polymer, semiconducting matrix component, and dopant. In those compositions in which a dopant is present, the amount by weight of the conductive polymer is generally greater than the amount by weight of the dopant.

In addition, the dopant can be present in an amount that corresponds to the molar amount of repeat units of the conductive conjugated polymer. For example, the dopant is typically present in the composition in an amount of about 0.01 moles dopant/moles conductive polymer repeat unit ("m/ru") to about 1 m/ru, wherein m is the molar amount of dopant and ru is the molar amount of conductive polymer repeat units. In some embodiments, the dopant is present in an amount of about 0.01 m/ru to about 0.5 m/ru, about 0.1 m/ru to about 0.4 m/ru, or about 0.2 m/ru to about 0.3 m/ru. Typically, the dopant is present in am amount of about 0.2-0.3 m/ru.

In some embodiments, a dopant is not present in the composition.

Devices

The present compositions can be used to produce HILs or HTLs that can be incorporated into a number of organic electronic devices. HIL/HTL layers can be prepared for these devices from the present compositions using methods known in the art, including, for example, solution or vacuum processing, as well as printing and patterning processes.

Examples of organic electronic devices that can be fabricated from the present compositions include, but are not limited to, OLEDs, PLEDs, PHOLEDs, SMOLEDs, ESDs, photovoltaic cells, as well as supercapacitors, hybrid capacitors, cation transducers, drug release devices, electrochromics, sensors, FETs, actuators, and membranes. Another application is as an electrode modifier including an electrode modifier for an organic field effect transistor (OFETS). Other applications include those in the field of printed electronics, printed electronics devices, and roll-to-roll production processes. Additionally, the compositions discussed herein may be a coating on an electrode.

Methods known in the art can be used to fabricate each of these electronic devices, in particular, for fabricating OLED and OPV devices.

For example, the present compositions can be used to form HILs for OLED devices. OLED devices are known in the art. See, for example, US Patent Appl. Publ. No. US 2006/00787661 A1, published Apr. 13, 2006. See also Hammond et al., US Patent Appl. Publ. No. US 2006/0175582 A1, published Aug. 10, 2006, entitled "Hole Injection/Transport Layer Compositions and Devices." The devices can comprise, for example, multi-layer structures that include, for example, an anode, including a transparent conductor such as ITO on glass or PET or PEN; a hole injection layer; an electroluminescent layer such as a polymer layer; a conditioning layer such as LiF, and a cathode such as for example Ca, Al, or Ba. See also U.S. Pat. Nos. 4,356,429 and 4,539,507 (Kodak).

Materials for and methods of preparing each of these layers or components are well known in the art. For example, conjugated polymers which emit light, for use in electroluminescent layers in OLEDS, are described, for example, in U.S. Pat. Nos. 5,247,190 and 5,401,827 (Cambridge Display Technologies). See also Kraft et al., "Electroluminescent Conjugated Polymers—Seeing Polymers in a New Light," *Angew. Chem. Int. Ed.*, 1998, 37, 402-428, including device architecture, physical principles, solution processing, multilayering, blends, and materials synthesis and formulation, which is hereby incorporated by reference in its entirety. Light emitters known in the art and commercially available can be used, including various conducting polymers as well as organic molecules, such as materials available from Sumation, Merck Yellow, Merck Blue, American Dye Sources (ADS), Kodak (e.g, AlQ3 and the like), and even Aldrich such as BEHP-PPV. Such polymer and small-molecule materials are well known in the art and are described in, for example, U.S. Pat. No. 5,047,687 issued to VanSlyke; and Bredas, J.-L., Silbey, R., eds., Conjugated Polymers, Kluwer Academic Press, Dordrecht (1991). See also "Organic Light-Emitting Materials and Devices," Z. Li and H. Meng, Eds., CRC Press (Taylor and Francis Group, LLC), Boca Raton (2007), in particular, chapter 1 (pp. 1-44), chapter 2 (pp. 45-294), chapter 3 (pp. 295-412), and chapter 10 (pp. 617-638), for a fuller description of OLED components and layers.

Similarly, the present compositions can be used to form HTLs for organic photovoltaic devices (OPVs). OPVs are known in the art. See, for example, US Patent Publ. No. 2006/0076050, published Apr. 13, 2006; see also WO 2008/018931, published Feb. 14, 2008, including descriptions of OPV active layers. See also U.S. provisional Appl. No. 61/043,654, filed Apr. 9, 2008, by Williams et al., entitled "Hole Collection Layer Compositions and Photovoltaic Devices," which is herein incorporated by reference in its entirety. The devices can comprise, for example, multi-layer structures that include, for example, an anode, including a transparent conductor such as indium tin oxide (ITO) on glass or PET; a hole injection layer and/or a hole transport layer; a P/N bulk heterojunction layer; a conditioning layer such as LiF; and a cathode such as for example Ca, Al, or Ba. For example, a variety of photoactive layers can be used in OPV devices. Photovoltaic devices can be prepared with photoactive layers comprising fullerene derivatives mixed with, for example, conducting polymers as described in for example U.S. Pat. No. 5,454,880 (Univ. Cal.); U.S. Pat. Nos. 6,812,399; and 6,933,436. Also, photoactive layers may comprise blends of conducting polymers, blends of conducting polymers and semiconducting nanoparticles, and bilayers of small molecules such as pthalocyanines, fullerenes, and porphyrins.

Device Performance Measurements

The fabricated devices can be tested for device performance using methods known in the art. For example, for OLEDs, methods known in the art can be used to measure such device performance parameters as brightness, efficiency, and lifetime.

Methods known in the art can be used to measure OLED performance parameters. Device performance measurements are typically carried out at 10 $mA/cm^2$. For example, the protocol outlined in Example 3 below is one method that can be used to measure OLED device performance parameters of current density ($mA/cm^2$), operating voltage (V), brightness ($cd/m^2$), and efficiency (cd/A).

Examples of typical OLED parameters are as follows:

Typical OLED device voltages can be, for example, from about 2 to about 15, or about 2 to about 8, or about 2 to 5, or from about 3 to about 14, or from about 3 to about 7. Typical device brightness can be, for example, at least 100 $cd/m^2$, or at least 500 $cd/m^2$, or at least 750 $cd/m^2$, or at least 1,000 $cd/m^2$. Typical device efficiencies can be, for example, at least 0.25 cd/A, or at least 0.45 cd/A, or at least 0.60 cd/A, or at least 0.70 cd/A, or at least 1.00 cd/A, or at least 2.5 cd/A, at least 4.00 cd/A, or at least 5.00 cd/A. Typical device lifetimes can be measured at 50 $mA/cm^2$ or up to 75 $mA/cm^2$ in hours and can be, for example, at least 50 hours, or at least 100 hours, or at least about 900 hours, or at least 1,000 hours, or at least 1100 hours, or at least 2,000 hours, or at least 5,000 hours, or at least 10,000 h, or at least 20,000 h, or at least 50,000 h.

The present compositions, when used as HILs or HTLs in organic devices, typically lead to increases in device parameters such as power efficiency. For example, in some embodiments, the present compositions, when used as HILs in OLEDs, can lead to increases in efficiency of at least 5%, or at least about 10% or greater, up to about 50%, depending on the operating voltage and quantum efficiency of the OLED in the absence of a good hole injection layer, compared to OLEDs fabricated using traditional HILs that contain an insulating matrix component.

Additional embodiments are provided with a series of non-limiting working examples.

WORKING EXAMPLES

Example 1

Representative Formulations

A series of HIL ink formulations were prepared containing PDBEETh and IMDPIB(PhF$_5$)$_4$ as conductive conjugated polymer and dopant, and NPB as semiconducting matrix polymer, as shown in Table 1 below.

The ink formulations were obtained using the following general procedure: Separate stock solutions of PDBEETh and IMDPIB(PhF$_5$)$_4$ in CHCl$_3$ were first prepared, each containing 0.5% (w/w) solids. Various amounts of each stock solution were combined as indicated in Table 1. For each formulation, the stock solution of IMDPIB(PhF$_5$)$_4$ was added to the PDBEETh stock solution so that the moles of IMDPIB (PhF$_5$)$_4$ dopant per repeat unit of the PDBEETh polymer was kept at 0.3. The resulting combined solution was refluxed for 2 h under a nitrogen blanket and stored in the glove-box. The indicated weight percent of NPB (added as a 0.5% (w/w)

stock solution in chloroform) was added to the doped PDBEETh to prepare the final ink formulation.

TABLE 1

Composition of HILs containing the doped PDBEETh and NPB as the hole transporting matrix.

| HIL # | CHCl$_3$, % | NPB, % | PDBEETh, % | IMDPIB(PhF$_5$)$_4$, % | Heating Temp. (°C.) | Time (h) |
|---|---|---|---|---|---|---|
| 1 | 99.5 | 0 | 0.285 | 0.215 | reflux | 2 |
| 2 | 99.5 | 0.125 | 0.213 | 0.162 | reflux | 2 |
| 3 | 99.5 | 0.25 | 0.142 | 0.108 | reflux | 2 |
| 4 | 99.5 | 0.375 | 0.071 | 0.054 | reflux | 2 |
| 5 | 99.5 | 0.5 | 0 | 0 | — | — |

% indicated are on weight basis, with respect to total weight of the composition (% (w/w))

Films were made from the above formulations using procedures known in the art. The films were annealed at 130° C. for 15 minutes and were characterized using UV-VIS-NIR spectroscopy. The solutions were prepared, spun and annealed in a glove box.

FIG. 1 presents the UV-VIS-NIR spectra of the films made from the five HIL formulations in Table 1. The presence of the neutral NPB and doped PDBEETh in each formulation are clearly shown.

Example 2

OLED Device Fabrication

OLED devices were fabricated following procedures known in the art. The devices were fabricated on indium tin oxide (ITO) surfaces deposited on glass substrates. The ITO surface was pre-patterned to define the pixel area of 0.05 cm$^2$. The device substrates were cleaned by ultrasonication in a dilute soap solution for 20 minutes followed by distilled water washes. This was followed by ultrasonication in isopropanol for 20 minutes. The substrates were dried under nitrogen flow, followed by treatment in a UV-Ozone chamber operating at 300 W for 20 minutes.

The cleaned substrates were then coated with an HIL ink formulation and dried at 90-170° C. for 5-15 minutes to form an HIL film layer. Dry film thicknesses ranged from approximately 20 nm to 60 nm. The coating process was done on a spin coater, but can be similarly achieved with spray coating, ink-jetting, contact printing, or any other deposition method capable of resulting in an HIL film of the desired thickness. The substrates were then transferred to a vacuum chamber where the remaining layers of the device stack were deposited by means of physical vapor deposition.

In this study, the HILs spun on top of the ITO surfaces included an example of the invention (HIL #4 in Table 1 of Example 1 above) and a comparative benchmark ("Comparative HIL"). The Comparative HIL is an aqueous HIL layer made from an ink formulation having the following composition:

| Material | Wt. % |
|---|---|
| P3MEET-S | 0.13 |
| Poly(4-vinylphenol) | 1.94 |
| Poly(styrenesulfonic acid) | 0.07 |
| Nafion | 0.07 |

| Material | Wt. % |
|---|---|
| Water | 53.79 |
| Butyl Cellosolve | 44.01 |

The layers deposited on top of the HIL included a hole transporting layer (HTL), an emissive layer (EML), a hole blocking layer (HBL), an electron transporting layer (ETL), and a metal cathode. The materials used were N,N'(dinaphthalen-1-yl)-N,N'-diphenyl-benzidine (NPB) as the HTL, bis (2-methyl-8-quinolinolato-N1,O8)-(1,1'-biphenyl-4-olato) aluminum (BAlq) doped with tris-(1-phenylisoquinoline) iridium III (Ir(piq)3) for the EML, BAlq as the HBL, and tris(8-hydroxyquinoline)aluminium (Alq3) as the ETL. All of these materials are commercially available and typically found in OLED structures in the art. The cathode layer was prepared by the sequential deposition of two metal layers, the first being a 3 nm to 5 nm layer of Ca (0.1 nm/sec) followed by a 200 nm layer of Al (0.5 nm/sec) with the base pressure at $5 \times 10^{-7}$ Torr.

The devices thus obtained were encapsulated with a glass cover slip to prevent exposure to ambient conditions by means of a UV-light curing epoxy resin cured at 80 W/cm$^2$ UV exposure for 4 minutes.

Example 3

OLED Device Testing

Performance tests were conducted on the OLED devices of Example 2. Typically, performance is quantified by a combination of different parameters such as operating voltage (should be low), brightness in nits (should be bright, luminous), efficiency in units of cd/A (reflecting how much electric charge is needed to obtain light from the device), and the lifetime under operation (time required to reach half of the initial luminance value at the start of the test). As such, the overall performance is very important in a comparative evaluation of HIL performance. Performance of the devices was tested using the using the following procedures.

The OLED devices comprise pixels on a glass substrate whose electrodes extend outside the encapsulated area of the device which contain the light emitting portion of the pixels. The typical area of each pixel in such devices is 0.05 cm$^2$. To test the devices, the electrodes were contacted with a current source meter such as a Keithley 2400 source meter with a bias applied to the indium tin oxide electrode while the aluminum electrode is earthed. This procedure results in positively charged carriers (holes) and negatively charged carriers being injected into the device which form excitons and generate light. In the OLED devices of this example, the HIL layer of the device assists the injection of charge carriers into the light emitting layer, resulting in a low operating voltage of the device (defined as the voltage required to run a given current density through the pixel).

Simultaneously, another Keithley 2400 source meter was used to address a large area silicon photodiode. This photodiode was maintained at zero volts bias by the 2400 source meter and placed in direct contact with area of the glass substrate directly below the lighted area of the OLED pixel. The photodiode is used to collect the light generated by the OLED device, converting it into photocurrent which is in turn read by the source meter. The photodiode current generated is quantified into optical units (candelas/sq. meter) by calibrating it with the help of a Minolta CS-200 Chromameter.

Voltage-current-light or IVL data for the OLED pixels of the devices were generated as follows: During the testing of the device, the Keithley 2400 source meter addressing the OLED pixel applied a voltage sweep to it. The resultant current passing through the pixel was measured. At the same time, the current passing through the OLED pixel resulted in light being generated, which then resulted in a photocurrent reading by the other Keithley 2400 source meter connected to the photodiode. This in turn enabled the measurement of other device characteristics, such as the lumens per Watt of electrical input power to the pixel (power efficiency) and candelas per ampere of pixel current.

Current density (mA/cm$^2$), operating voltage (V), brightness (cd/m$^2$), and efficiency (cd/A) were measured for the OLED devices of Example 2 containing an Inventive HIL and a comparative HIL The results are presented in Table 2. The Inventive HIL was made using the HIL ink formulation #4 of Example 1. The Comparative HIL was made as described above in Example 2. Devices containing the inventive HIL produced greater brightness and higher efficiency than those containing the comparative HIL.

TABLE 2

| HIL System | Device structure | Current Density (mA/cm$^2$) | Voltage (V) | Brightness (cd/m$^2$) | Efficiency (cd/A) |
| --- | --- | --- | --- | --- | --- |
| Comparative HIL | ITO/HIL/ NPB/BAlq: Ir(plq)3 (15 wt %)/ BAlq/Alq3/ Ca/Al | 30 | 9.95 | 1180 | 3.9 |
| Inventive HIL | | 30 | 12.6 | 1270 | 4.3 |

OLED devices can also be tested for their lifetime performance. Lifetime performance is measured using lifetime testers where a constant current is sourced through the tested devices. The current to the device is adjusted so that it gives a certain initial luminance value. For lifetime performance tests, this value is typically set at 1,000 candela/meter$^2$. The luminance decay and voltage rise over time are then noted.

OLED devices fabricated in a manner similar to those of Example 2 above were tested for lifetime performance. The OLED devices contained the Comparative HIL and Inventive HIL used for the device efficiency measurements shown in Table 2, and had the general structure ITO/HIL/NPB/BAlq:Ir(piq)3 (15 wt %)/E246/EI-101/A (where E246 refers to an electron transport layer, and EI-101 refers to an electron injection layer, available from OLED-T Ltd., Enfield, UK) The results of the lifetime performance tests are shown in Table 3. Devices containing the inventive HIL produced greater brightness and longer lifetimes than those containing the comparative HIL.

TABLE 3

| HIL System | Device structure | Brightness (cd/m$^2$) under lifetest | Lifetime (time to 50% of beginning luminance) |
| --- | --- | --- | --- |
| Comparative HIL | ITO/HIL/NPB/BAlq:Ir(piq)3 (15 wt %)/E246/EI-101/Al | 1,000 | 10[1] |
| Inventive HIL | | 2,000 | 713[1] |

[1] at 2,000 nits

What is claimed is:

1. A method comprising:
   providing a composition comprising at least one conductive conjugated polymer, at least one semiconducting matrix component that is different from the conductive conjugated polymer, and optionally at least one dopant, wherein the composition comprises less than about 5% (w/w) of an insulating matrix component; and
   incorporating the composition into an electronic device.

2. The method of claim 1, wherein the composition comprises less than about 3% (w/w) of the insulating matrix component, or less than about 1% (w/w) of the insulating matrix component, or less than about 0.1% (w/w) of the insulating matrix component, or less than about 0.01% (w/w) of the insulating matrix component.

3. The method of claim 1, wherein the conductive conjugated polymer comprises a polythiophene.

4. The method of claim 1, wherein the conductive conjugated polymer comprises a regioregular polythiophene, or a sulfonated polythiophene, or a sulfonated regioregular poly(3-substituted)thiophene.

5. The method of claim 1, wherein the composition comprises about 1 wt % to about 99 wt % conductive conjugated polymer with respect to the total amount of conductive conjugated polymer, semiconducting matrix component, and dopant, if present.

6. The method of claim 1, wherein the semiconducting matrix component is a semiconducting polymer.

7. The method of claim 1, wherein the semiconducting matrix component is a semiconducting polymer, and wherein the semiconducting polymer comprises a polyaromatic polymer or a polyvinyl aromatic polymer.

8. The method of claim 1, wherein the semiconducting matrix component is a semiconducting polymer, and wherein the semiconducting polymer comprises polyvinyl naphthalene, polyvinyl anthracene, or polyvinyl carbazole.

9. The method of claim 1, wherein the semiconducting matrix component is a semiconducting polymer, and wherein the semiconducting polymer comprises polyanthracene or polynaphthalene.

10. The method of claim 1, wherein the semiconducting matrix component comprises a polymer having one or more repeat units comprising a hole transport compound.

11. The method of claim 1, wherein the semiconducting matrix component is a semiconducting small molecule.

12. The method of claim 1, wherein the semiconducting matrix component is a hole transporting compound.

13. The method of claim 1, wherein the semiconducting matrix component is a polycyclic aromatic compound selected from anthracene, naphthalene and fluorene.

14. The method of claim 1, wherein the semiconducting matrix component is a triarylamine.

15. The method of claim 1, wherein the composition comprises about 1 wt % to about 99 wt % semiconducting matrix component with respect to the total amount of conductive conjugated polymer, semiconducting matrix component, and dopant, if present.

16. The method of claim 1, wherein the dopant is present, and the dopant is a redox dopant.

17. The method of claim 1, wherein the dopant is present and the dopant is a redox dopant selected from quinones, boranes, carbocations, bora-tetraazapentalenes, aminium or ammonilium salts, sulfonium salts, oxonium salts, selenonium salts, nitrosonium salts, arsonium salts, phosphonium salts, iodonium salts, metal salts, and combinations thereof.

18. The method of claim 1, wherein the dopant is present and the dopant is a photoacid.

19. The method of claim 1, wherein the dopant is present and the dopant is a photoacid that is an iodonium salt represented by

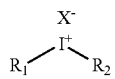

wherein independently $R_1$ is an optionally substituted aryl group, independently $R_2$ is an optionally substituted aryl group, and $X^-$ is an anion.

20. The method of claim 19, wherein the iodonium salt is selected from 4-isopropyl-4'-methyldiphenyliodonium tetrakis(pentafluorophenylborate) (IMDPIB(PhF$_5$)$_4$), diphenyliodonium hexafluorophosphate (DPIPF$_6$), diphenyliodonium para-toluene sulfonate (DPITos), bis-(4-tert-butylphenyl)iodonium trifluoromethane sulfonate ($^t$BDPITFSO$_3$), and diphenyliodonium perfluoro-1-butane sulfonate (DPIPFBSO$_3$).

21. The method of claim 1, wherein the dopant is present and the dopant is covalently attached to the conductive conjugated polymer.

22. The method of claim 1, wherein the composition consists essentially of the conductive conjugated polymer, the semiconducting matrix component, and the dopant.

23. The method of claim 1, further comprising an organic solvent.

24. The method of claim 1, wherein the composition consists essentially of the conductive conjugated polymer, the semiconducting matrix component, the dopant, and an organic solvent.

25. The method of claim 1, wherein the incorporating step comprises depositing the composition onto a substrate, and drying the deposited composition to form a hole transport layer or a hole injection layer.

26. The method of claim 25, wherein the composition is deposited by spin coating, spray coating, inkjet printing, or contact printing.

27. The method of claim 25, further comprising incorporating another layer into the electronic device by vapor deposition, wherein the electronic device is a hybrid device.

28. The method of claim 25, wherein the electronic device has an efficiency of at least 4.00% cd/A.

29. The method of claim 25, wherein the hole transport layer or hole injection layer is about 60 nm to about 200 nm thick.

30. The method of claim 25, wherein the hole transport layer or hole injection layer is substantially transparent to visible light.

31. The method of claim 1, wherein the composition is incorporated into a hole transport layer or hole injection layer, and wherein the hole transport layer or hole injection layer leads to an increase in device efficiency of at least 5%.

32. The method of claim 1, wherein the electronic device is an organic light emitting diode (OLED) or an organic photovoltaic device (OPV).

33. A method comprising:
co-mixing a first composition comprising at least one conductive conjugated polymer and a second composition comprising at least one semiconducting matrix component that is different from the conductive conjugated polymer to form a third composition, wherein the third composition comprises less than about 5% (w/w) of an insulating matrix component.

34. The method of claim 33, wherein the first composition further comprises at least one dopant.

35. The method of claim 33, wherein the first composition further comprises at least one solvent.

36. The method of claim 33, wherein the second composition further comprises at least one solvent.

37. The method of claim 33, wherein the first composition comprises a regioregular polythiophene and a redox dopant, and the second composition comprises a semiconducting small molecule.

38. The method of claim 33, wherein the third composition comprises less than about 3% (w/w) of the insulating matrix component, or less than about 1% (w/w) of the insulating matrix component, or less than about 0.1% (w/w) of the insulating matrix component, or less than about 0.01% (w/w) of the insulating matrix component.

39. The method of claim 33, wherein the co-mixing step comprises (a) combining the conductive conjugated polymer with at least one solvent and at least on dopant to form a doped conductive polymer solution, and (b) adding the semiconducting matrix component to the doped conductive polymer solution.

40. A method comprising:
co-mixing a first composition comprising at least one conductive conjugated polymer and a second composition comprising at least one semiconducting matrix component that is different from the conductive conjugated polymer to form a third composition, wherein the third composition comprises less than about 5% (w/w) of an insulating matrix component; and
depositing the third composition onto a substrate to form a hole transport layer or hole injection layer, wherein the hole transport layer or hole injection layer is incorporated into an electronic device.

* * * * *

UNITED STATES PATENT AND TRADEMARK OFFICE
CERTIFICATE OF CORRECTION

PATENT NO. : 8,383,454 B2  
APPLICATION NO. : 13/316324  
DATED : February 26, 2013  
INVENTOR(S) : Christopher T. Brown, Matthew K. Mathai and Venkataramanan Seshadri Page 1 of 1

It is certified that error appears in the above-identified patent and that said Letters Patent is hereby corrected as shown below:

ON THE TITLE PAGE:
Item (75) the Inventor information should read:

-- (75)    Inventors:    Christopher T. Brown, Pittsburgh, PA (US);  
Matthew K. Mathai, Gibsonia, PA (US);  
Venkataramanan Seshadri, Pittsburgh, PA (US) --

Signed and Sealed this  
Fourteenth Day of May, 2013

Teresa Stanek Rea  
*Acting Director of the United States Patent and Trademark Office*